United States Patent [19]

Görike et al.

[11] 4,005,267

[45] Jan. 25, 1977

[54] ARRANGEMENT FOR CONVERTING OSCILLATIONS IN HEADPHONES

[75] Inventors: Rudolf Görike; Ernst Pless, both of Vienna; Werner Fidi, Baden; Alexander Fritz, Vienna, all of Austria

[73] Assignee: AKG Akustische u. Kino-Gerate Gesellschaft m.b.H., Austria

[22] Filed: May 12, 1975

[21] Appl. No.: 576,431

[30] Foreign Application Priority Data

| | | |
|---|---|---|
| May 17, 1974 | Austria | 4123/74 |
| June 14, 1974 | Austria | 4931/74 |
| Mar. 28, 1975 | Austria | 2412/75 |

[52] U.S. Cl. .......... 179/1 J

[51] Int. Cl.[2] .......... H03H 9/30

[58] Field of Search .......... 181/160, 163, 156, 171, 181/172; 179/1 J

[56] References Cited

UNITED STATES PATENTS 3,922,489 11/1975 Ojima et al. .......... 179/1 J

*Primary Examiner*—William C. Cooper

*Attorney, Agent, or Firm*—McGlew and Tuttle

[57] ABSTRACT

An arrangement for headphones for converting frequency modulated audio oscillations into amplitude modulated oscillations, and particularly for rendering audible the vibrato of electronic musical instruments, such as electronic organs, includes a housing having an electroacoustic transducer therein with a diaphragm having a smooth frequency response zone which is connected to at least one mechanical transit-time member having a transit time from one end to the other not greater than 20 ms. The transit-time member is advantageously a helical spring which extends axially through the electroacoustic transducer or through a central ferromagnetic core thereof. The portion of the spring within the core is advantageously made of a thicker wire and of a smaller diameter than the remaining core so that it does not contact the walls thereof.

26 Claims, 12 Drawing Figures

ARRANGEMENT FOR CONVERTING OSCILLATIONS IN HEADPHONES

FIELD AND BACKGROUND OF THE INVENTION

The present invention relates to an arrangement for headphones for converting frequency modulated audio oscillations into amplitude modulated oscillations and, in particular, to a new and useful arrangement for rendering audible the vibrato of electronic musical instruments, such as electronic organs.

DESCRIPTION OF THE PRIOR ART

The present invention relates to an arrangement for headphones, permitting the converting of frequency modulated audio oscillations with a small frequency variation into amplitude modulated oscillations. Such an arrangement is particularly suitable for rendering audible the vibrato of electronic musical instruments, for example, electronic organs, where the reproduction is effected through an electroacoustic equipment. That is, it has been found while using loudspeakers for the sound radiation, that the vibrato is made audible without difficulties, whereas, with the use of headphones instead of loudspeakers, this possibility is not given. The invention, therefore, is directed to headphones comprising a built-in system by means of which frequency modulated audio signals, such as the frequency vibrato of electronic organs, can be made audible at least in the same manner as in loudspeakers, or even more intensely.

As is well known, in electronic musical instruments, particularly electronic organs, the vibrato is produced so that the audio signal inclusive of all harmonics is modulated with some cycles per second. Tests have shown that such frequency modulated audio oscillations, when reproduced by means of loudspeakers, are converted into amplitude modulated oscillations so that they are easily audible by the human ear which, although not well adapted to perceive small pitch variations, is distinctly responsive to small variations in sound intensity.

Thus, a loudspeaker of a size usual with electroacoustic equipment is presumably capable of converting the small frequency variations of a vibrato into amplitude variations. However, such a conversion is possible only as far as the frequency response curve of the system comprises, in addition to the fundamental resonance, a large number of closely adjacent small resonances thus kind of a comb-filter structure at the sides of which the audio frequency modulation is converted into amplitude variations. Actually, a conventional cone loudspeaker shows a frequency response characterized by a plurality of closely adjacent alternating peaks so that satisfactory conditions are given for a conversion.

While comparing this response to the frequency curve of a headphone, for example, such as one equipped with a dome-shape diaphragm, it happens instantly that, again without regard to the fundamental resonance and one or more sporadically occurring cavity resonances, the headphone response appears as an entirely smooth line. Evidently, the dense sequence of alternating peaks typical for a loudspeaker, with sides at which the conversion of the frequency modulation into amplitude variations takes place, is absent in a headphone system.

The absence of such small resonance points, closely succeeding one another in the frequency characteristic of a headphone, explains the fact that the vibrato of electronic musical instruments, particularly electronic organs, is hardly perceptible for the human ear, because a headphone is unable to convert the small frequency variations of the vibrato into corresponding amplitude variations.

In consequence, in order to achieve the objective of the invention, it is necessary to provide an arrangement capable of being accommodated within the small space available in a headphone and comprising a sort of a comb filter structure having sufficiently steep and sufficiently numerous sides in the spectrum of the audio frequency band, as it is the case, for example, with larger loudspeaker diaphragms, spaces, or uni- or multi-dimensional transit-time elements.

There is a variety of solutions of the problem posed, and the measures to be taken are of mechanical or electronical nature. Electronic means, at least up to date, are still considerably expensive and that is why the invention is intentionally limited to mechanical oscillating elements which may be coupled with an oscillating element of the transducer.

SUMMARY OF THE INVENTION

Thus, the invention relates to a mechanism for converting frequency modulated audio oscillations into amplitude modulated oscillations, particularly for rendering audible the vibratos of electronic musical instruments, such as electronic organs, and this mechanism is characterized, in accordance with the invention, in that the diaphragm of the built-in electroacoustic transducer of a headphone having smooth frequency-response zones is connected to at least one mechanical transit-time member having a transit time from one end to the other smaller than or at most equal to 20 ms.

To prevent the occurrence of excessive reverberation components which would produce a disturbing secondary effect, it is necessary to appropriately damp the respective oscillating system which is used, for example, a helical spring. Reverberation periods in the order of magnitude of half a second are no more perceived as disturbing in themselves. In excess of that, however, it is advisable to use measures known per se and disclosed, for example, in the U.S. Pat. No. 3,566,310 to change the transmission properties of the spring so as to obtain a statistical resolution of the signal both in the time and the frequency range. In this respect, requirements are to be imposed on the delay element, for example, a helical spring, for a good quality of the conversion of frequency modulated signals into amplitude modulated signals as in good reverberation devices.

Due to the short transit time of approximately 20 ms sufficient for solving the problem posed, the transit-time members used in the inventive headphone are substantially smaller than in reverberation devices so that it is possible to mount them into headphones of usual size. The low costs of the component parts also permit a construction of the inventive device in an economical manner.

At a cursory inspection of the invention, the impression could arise that the arrangement is a system which has become known in electroacoustics in various design under the designation "reverberation device" and someone could hold that such a reverberation device also meets the requirements of the invention. This is not the case at all, however, since aside from the fact that the objective of the invention is not to produce an artificial reverberation, the known reverberation devices, as far as they have to operate in a somewhat satisfactory manner, comprise delay lines in which the delay time from one end to the other is at least ten times greater than the transit time of the delay member provided in the invention. Consequently, the natural resonance density of such systems is rather high, in most cases between 0.3 and 1 resonance point per Hz. Should a frequency modulated audio signal, where the frequency variation for a vibrato is usually a semitone and the modulation frequency might be in the range between 3 and 7 Hz, be applied to such a delay member, the result would be undesirable secondary phenomena, particularly because of the frequency multiplication due to excessive density of the consecutive resonance points. Therefore, a satisfactory effect in accordance with the invention is obtainable only with a not too high density of the resonance points, i.e., approximately in the lower and middle range corresponding to 0.03–0.05 resonance points per Hz which, in its turn, corresponds to a transit time of approximately 20 ms.

For a reverberation device, such a short delay time is practically useless in the same manner as, inversely, a delay member having a long delay time usual with a reverberation device cannot ensure the desired inventive effect.

Aside therefrom, it should be noted that the problem to which the invention is directed is also completely different from that to be solved in devices for producing an artificial reverberation.

In a first embodiment of the invention, the mechanical transit-time member is a helical spring axially extending through the electroacoustic transducer and is secured, by its one end, to the center point of the transducer diaphragm and, by its other end, to the housing of the headphone. To save space, it is useful, in accordance with the invention, to provide an electrodynamic transducer system comprising a moving coil, where the ferromagnetic core, which may also be a permanent-magnet plug, is provided with an axial bore permitting the helical spring to extend therethrough contactlessly. As far as it would not be possible to provide a sufficiently large bore in the ferromagnetic core permitting a contactless accommodation of a helical spring having an optimum diameter, it is provided, in accordance with the invention, to use unequal helical-spring portions, a portion having a larger diameter for the part outside the bore of the ferromagnetic core or the permanent-magnet plug, and a portion having a smaller diameter for the inside of the bore. For reasons of matching, it is advantageous to wind the portion of the helical spring located outside the magnet system of the transducer of a thinner wire than the other portion.

In a second embodiment of the invention, the mechanoacoustic transit-time member, preferably a helical spring, is designed as a coupling member mounted between two diaphragms which are spaced from each other and extend in two at least approximately parallel planes and of which one is an active diaphragm directly actuated by the transducer system, while the other is only a passive diaphragm which is capable of oscillating but not directly actuated by the transducer and which, while the headphone is put on, is located closer to the ear of the user than the active diaphragm actuated by the transducer system.

This and still further measures make it possible to obtain a favorable mixture of the vibrato component converted into amplitude modulated oscillations and the direct sound coming from the active diaphragm.

In the embodiments just described, at least one helical spring incited to compression oscillations is used as the transit-time member. However, as shown in further embodiments, the helical spring or springs may be incited to transverse oscillations which also leads to the desired effect of converting frequency modulated oscillations into amplitude modulated ones.

In the simplest case, it is sufficient to use a single helical spring as the transit-time member which is positioned closely in front of the diaphragm, in a plane parallel to the diaphragm and, with the headphone put on, in the coupling space between the diaphragm and the ear entrance. This helical spring is actuated through a coupling pin projecting from the diaphragm and acting on the spring eccentrically so that spring portions of unequal length are formed at the two sides of the actuation point. The spring is held at its two free ends by means of supports which are provided either on the housing or on parts which are secured thereto.

The unsymmetrical position of the actuation point on the spring is advantageous insofar as thereby, the disturbing periodicities unfavorably affecting the acoustic pattern can be largely eliminated.

This also applies to an embodiment in which two helical springs are incited by the diaphragm of the transducer system to transverse oscillations. In addition, the springs are advantageously designed differently as to their dimensions, mechanical properties, surface finish or the like, so that the optimum density of resonance points and a sufficiently diffused resolution of the faded-away signals is ensured for different frequency ranges.

The coupling elements establishing communication between the actuating diaphragm and the two springs may produce unequal filtering effects due to their damping capacity, rigidity and mass so that, on the one hand, the two springs can be decoupled and, on the other hand, the frequency band to be transmitted can be apportioned to the two springs.

In another embodiment of the invention, the inventive arrangement is united in the headphone with a further acoustic transducer of conventional design and, in addition, an adjustable member controlling the proportional response of the two transducers is used. The member controlling the acoustic power of each of the transducers may be an electric control element or also a mechanical device connected in the acoustic path between the transducer and the ear.

Thereby, the transmitted sound received in the headphone can be varied within wide limits as to the stereophonic impression and adapted to the subjective requirements of the user. The impression that the acoustic source is located in the head or behind, close to the head, can be eliminated with the inventive arrangement. The invention makes it also possible to aurally better locate the acoustic source. One has the feeling to be able to determine exactly from what direction and through what distance the sound comes to the ear.

The second transducer, preferably a dynamic transducer, may be mounted on a plate common for both systems and the mechanoacoustic transit-time member, for example in the form of a helical spring arrangement, which is connected to the diaphragm of one of the transducers, may be mounted in or on the same plate.

Advantageously, the control member is also assembled with the mounting plate, in which case, the respective actuating element is provided on the back of the plate, i.e., with the headphone put on, at the side remote from the ear.

Accordingly, it is an object of the invention to provide an arrangement for headphones for converting frequency modulated audio oscillations into amplitude modulated oscillations and, particularly, for rendering audible vibrato of electronic musical instruments, such as electronic organs, which comprises a housing having an electroacoustic transducer therein with a diaphragm which is connected to at least one mechanical transit-time member having a transit time from one end to the other not greater than 20 ms.

A further object of the invention is to provide a device for converting frequency modulated audio oscillations into amplitude modulated oscillations which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference should be had to the accompanying drawings and descriptive matter in which there are illustrated preferred embodiments of the invention.

DESCRIPTION OF THE PREFERRED EMBODIMENTS

Figure 1:
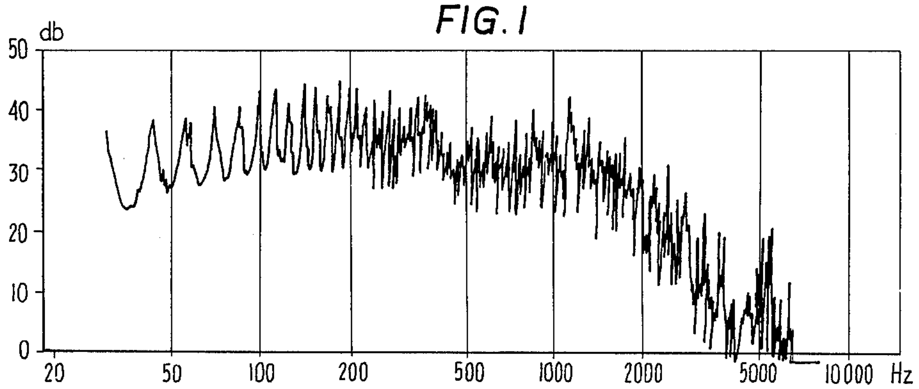
FIG. 1 is a curve showing the frequency response of a unidimensional delay line, for example, having a statistical transient response.

The realization of the inventive idea requires a device having as many as possible resonance points in the audible frequency range which are densely adjacent each other and have sides which are as steep as possible. Such a device is, for example, a unidimensional delay line, also termed a transit-time member. As it is also usual in conventional reverberation devices, that such a transit-time member has to show a statistical transient response; which means, that due to a suitable design and treatment, particularly of the surface of such a transit-time member, the resonance peaks on both sides are displaced relative to one another randomly, i.e., completely irregularly. FIG. 1 shows the resonance curve of such a unidimensional transit-time member, for example, of a helical spring, with statistically distributed irregularities on its surface. It is easy to understand that if an audio signal modulated with a small frequency variation is sent through a transit-time member affected with the frequency response shown, the transit-time member represents a sort of a comb filter with edges at which the frequency modulated signals are converted into amplitude modulated signals and, as such, become well audible.

As may be learned from FIG. 1, the peaks on both sides of the response curve are very close to each other and are spaced by a distance smaller than 5 Hz. Therefrom, it may be learned that the use of such a transit-time member meets all requirements which are assumed as necessary for the inventive headphone.

Figure 2:
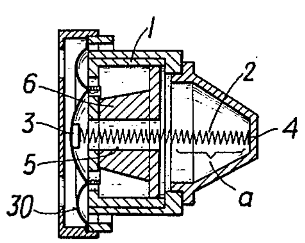
FIG. 2 is a diagrammatic sectional view of a headphone constructed in accordance with the invention.

A first embodiment of the invention is shown in FIG. 2. Substantially, the arrangement comprises an electrodynamic headphone system 1 in which a helical spring 2 serves as the transit-time member. The spring 2 is connected, on its side, directly to a diaphragm 30 or to the dome zone 3 thereof and, on its other side, to a fixed point, for example, to the housing 4 of the headphone. Advantageously, helical spring 2 extends through a bore 5 provided in a magnet plug 6 wherefore relatively little space is needed.

The system operates as follows: Since on its one side, helical spring 2 is firmly connected to the diaphragm, it is incited to compression oscillations. Due to the numerous, closely adjacent resonance peaks distributed over the entire audible range, it is practically to be assumed that any frequency modulated signal comes at least close to one of the resonance points of helical spring 2. This, however, already ensures a conversion of the frequency modulation into an amplitude modulation because at any even very small variation of the frequency of a signal, its amplitude is also influenced due to the particular frequency response of helical spring 2. Because of the great edge steepness of the resonance points of spring 2, already small frequency variations, such as those occurring during the vibration of electronic musical instruments, result in a distinct amplitude variation which, due to the coupling of spring and diaphragm, is radiated by the diaphragm in a well audible manner.

As already mentioned, it is advisable, in cases where for some reasons it is not possible to provide a bore in the magnet system (core or permanent-magnet plug 6) so as to have an optimum diameter for helical spring 2, a portion of the spring extending within bore 5 is made of a thicker wire but is wound with a smaller diameter relative to the optimum diameter of the spring, and the other portion of the spring 2 is made of a thinner wire but is wound with a larger diameter.

The two portions of the spring may be dimensioned so that the characteristic impedances are equal to each other, thus no reflections occur at the connection of the two spring portions.

Figure 3:
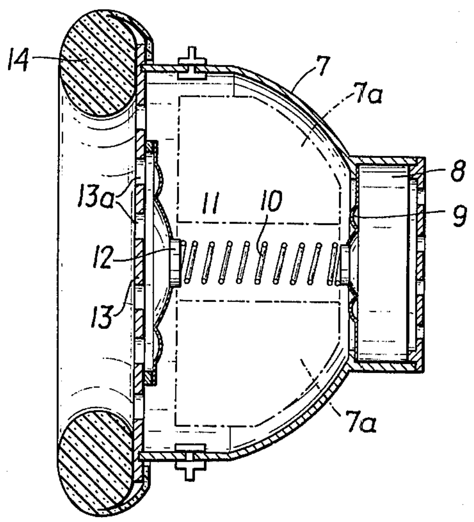
FIG. 3 is a view, similar to FIG. 2, of another embodiment of the invention.

FIG. 3 is a sectional view of an embodiment showing the features of the invention, in which, unlike in the embodiment shown in FIG. 2, not one and the same diaphragm is used for radiating the direct, as well as the delayed sound, but a separate diaphragm is provided for each of the acoustic components.

In the bottom of a dome- or box-shape headphone housing 7, the transducer system proper 8 is mounted.

The transducer system includes a diaphragm 9 facing the wide opening of housing 7. This opening is closed by a perforated plate 13 which is provided with holes 13*A*. A diaphragm 11 is mounted on plate 13 and has a dome zone 12 to which one end of a helical spring 12, serving as transit-time member, is secured. The other end of the spring 12 is connected to diaphragm 9 of the transducer system. Openings (not shown) may be provided around diaphragm 11, permitting the passage to the ear of the direct sound coming from the transducer diaphragm 9. In this manner, it is possible to obtain a favorable mixture of the delayed portion of the signal with the non-delayed portion because the desired proportion of the two signal components is easily adjustable through the number and location of holes 13*a* or their distribution over the surface of the perforated plate 13.

Between the diaphragm 9 actuated directly by the transducer system 8, and termed the active diaphragm in the following, and the second diaphragm 11 mounted on the perforated plate 13 and termed the passive diaphragm in the following, there is a cavity formed in housing 7 into which a filler body 7*a* of a porous or solid material may be placed. Advantageously, an elastic foam material will be used for this purpose. A first function of the filler body 7*a* is to damp any cavity resonances which may occur. However, it may also be used for damping the helical spring 10, provided the filler body 7*a* takes a shape at which the material, preferably a foam material, contacts the helical spring 10 entirely or partly and with more or less pressure.

If necessary, the headphone may be provided in a well-known manner with an ear cushion 14 which ensures, in dependence on the nature of its material, a firm coupling with the ear or if, for example, foam material with open pores is used, a more or less intense communication between the coupling volume and the outside air.

In the embodiment of FIG. 3, it is also possible to provide a device permitting the closing of the openings 13*a* for the diaphragm 9 which is operable from the outside selectively, either entirely or partly, and thus makes it possible to adapt the reproduction to individual requirements of the users of the inventive headphone. Another advantage of this embodiment is that the diameter of the helical spring 10 is no longer dependent on the diameter of a given bore but can be chosen freely.

Figure 5:
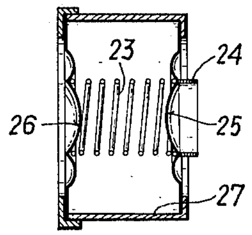
FIG. 5 is a view of a variant of FIG. 3.
Figure 10:
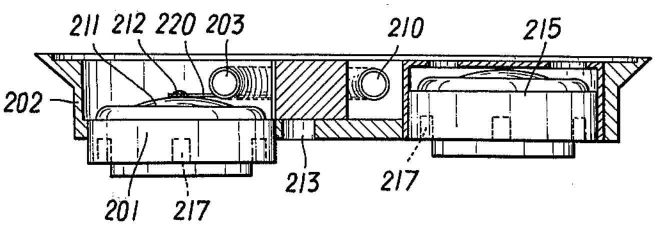
FIG. 10 is a section taken on the line X—X of FIG. 9.

It has been found particularly advantageous to provide a diameter of helical spring in FIG. 3, 10, or 23 in FIG. 5, corresponding to the diameter of the moving coil 24, actuating the active diaphragm 25, as illustrated in FIG. 5.

Figure 4:
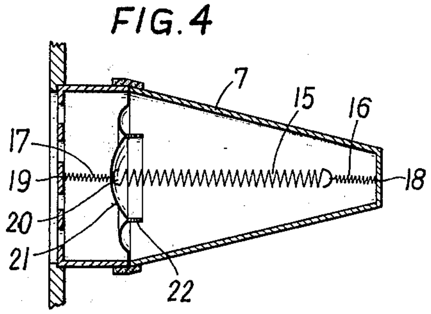
FIG. 4, is a view, similar to FIG. 2, of still another embodiment of the invention.

In the embodiment shown in FIG. 4, the headphone is designed in accordance with the invention and the transit-time member comprises a helical spring 15 of larger diameter mounted between two helical springs 16, 17 of smaller diameter. The free ends of the thinner springs 16, 17 are secured to housing 7 at points 18, 19. The connection point of thin spring 17, mounted in front of diaphragm 21, with helical spring 15 mounted behind diaphragm 21, coincides with the vertex of diaphragm 21 to which both springs 17 and 15 are secured. Thin springs 16, 17 represent an elastic suspension of the thicker spring 15.

In the embodiments of FIGS. 2 to 5, the transit-time member comprises one or more helical springs which are to be incited to compression oscillations. However, the objective of the invention may also be attained with helical springs which are incited to transverse oscillations. Such a construction in principle is illustrated, for example, in FIGS. 6 and 7.

Figure 6:
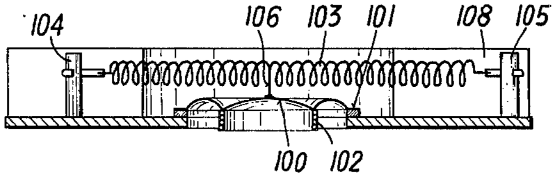
FIG. 6 is a view similar to FIG. 2 of still another embodiment of the invention.

As may be learned from the elevational view in FIG. 6, the headphone diaphragm 100 is secured to the headphone housing by its rim 101. Close to the front side of diaphragm 100, in a plane parallel to the plane of the diaphragm, a helical spring is mounted between two fixed supports 104, 105 and are slightly stretched. For reasons which have already been mentioned in the introductory part, helical spring 103 is not actuated in the middle but it is actuated unsymmetrically so that at both sides of the actuation point, the spring sections are of unequal length. The dome of diaphragm 100 is connected to helical spring 103 by means of a pin 106. In the same manner as in the embodiments comprising helical springs incited to compression oscillations, in headphones in which the springs are incited to transverse oscillations, the properties of helical spring 103, particularly the numerous resonance points, have the effect that the frequency modulated signals are converted into amplitude modulated signals. Since helical spring 103 is connected to diaphragm 100 through coupling pin 106, the amplitude modulated signals are radiated through diaphragm 100.

Figure 7:
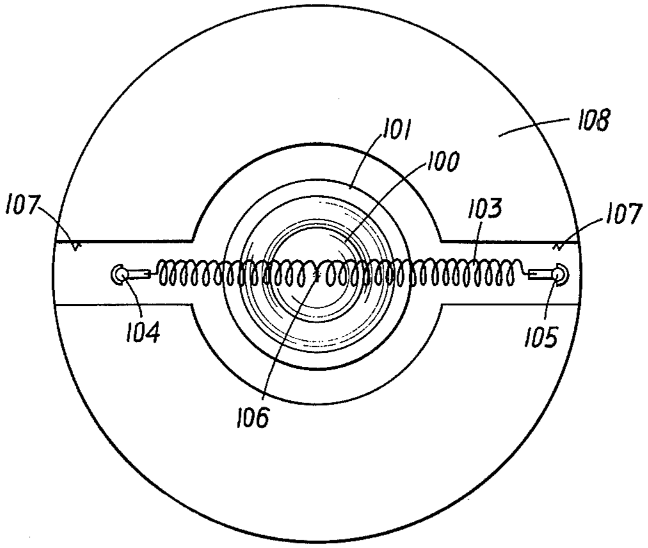
FIG. 7 is a top plan view of the device shown in FIG. 6.

To obtain the coupling space between diaphragm 100 and the ear entrance as small as possible, helical spring 103 is accommodated in a groove 107 of a filler body 108, as shown in FIG. 7. The filler body may be made of a solid or also of a foam material. The desired effect can be substantially increased by the use of two helical springs as illustrated, for example, in FIG. 8. Only the top plan view is shown, since the elevational view is identical with FIG. 6.

Figure 8:
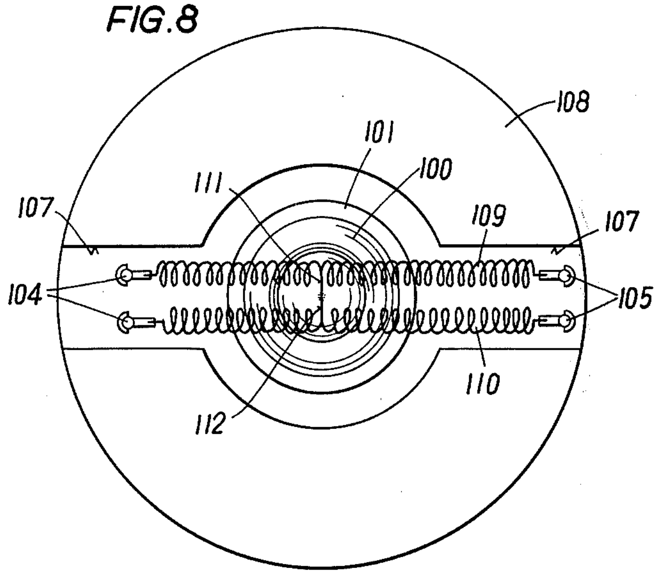
FIG. 8 is a top plan view of still another embodiment of the invention.

As shown in FIG. 8, the two springs 109, 110 are again received in a groove 107 of filler body 108, and are adjacent each other. On the dome of diaphragm 100, a separate coupling pin 111, 112 is provided for each of the two springs 109, 110. This arrangement has the advantage that by providing an appropriate damping, stiffness and mass of each of the coupling pins, different filter effects can be obtained so that the two springs can be decoupled and the frequency range can be apportioned to the two springs.

Figure 9:
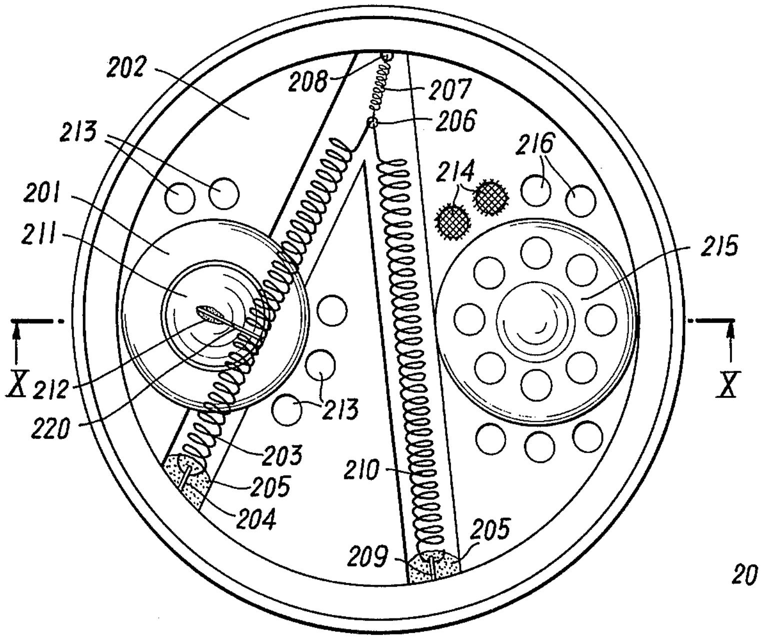
FIG. 9 is a diagrammatical top plan view of still another embodient of the invention.
Figure 11:
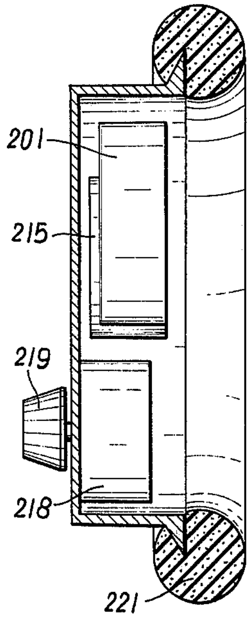
FIG. 11 is a sectional view of still another embodiment of the invention.

FIGS. 9 to 11 are diagrammatical views of another embodiment in which two acoustic transducers are provided mounted on or in a common plate, one of them being coupled with a transit-time mechanism. The last-named transducer 201 is mounted in a recess of mounting plate 202. In this case, the helical spring arrangement comprises two parts 203 and 210 having a common node point 206 wherefrom a thin helical spring 207 extends to a support 208 provided on mounting plate 202. One end of part 203, which is connected to diaphragm 211 of transducer 201 through a coupling element 220, is suspended by a straightened turn from fixed support 204, this support being surrounded with damping material 205, for example, an elastomer. In the same manner, the free end of spring part 210 is secured to support 209 of mounting plate 202.

The coupling between diaphragm 211 and helical spring 203, shown in FIG. 9, is designed so that predominantly torsional oscillations and also partly transverse oscillations are produced by the diaphragm motion. The oscillations propagate through spring 203 and are transmitted to spring 210 through common point 206. At support 209, they are reflected, pass again through the two spring parts and are again reflected on support 204. This is repeated until the oscillation energy is consumed by friction losses.

In order to establish the acoustic path, known per se, from the front side to the back side of the transducer diaphragms, openings 213, 216 are provided in the mounting plate 202 around the transducers 201, 215, which may be covered, as usual, with an acoustic friction resistance 214.

The sectional view of FIG. 10 shows the manner in which the transducers 201 and 215 are mounted in mounting plate 202. By sunken mounting of transducer 201 in mounting plate 202, space is obtained for a helical spring 203. The other helical spring 210 of the arrangement extends practically in the plane of mounting plate 202 and, substantially, between the two transducers. Transducer 215 is coupled with the helical spring arrangement and is mounted substantially within mounting plate 202. FIG. 10 indicates the design of the bores 213, 216 as to their cross-section and how the damping material 214, 217 (shown in FIG. 9), is placed therein.

FIG. 11 is a sectional view of an earpiece comprising two transducers and, also in accordance with the invention, a potentiometer 218 in addition, which may be actuated by means of a knob 219 from the outside. A soft ear cushion 221 usual with modern headphones may also be provided and, if necessary, made of a sound transmitting material, for example, designed as a foam netting cushion in which case, the openings 213 and 216 might be omitted. The ear cushion may also be made of a material closing the earpiece at the ear in a soundproof manner.

Figure 12:
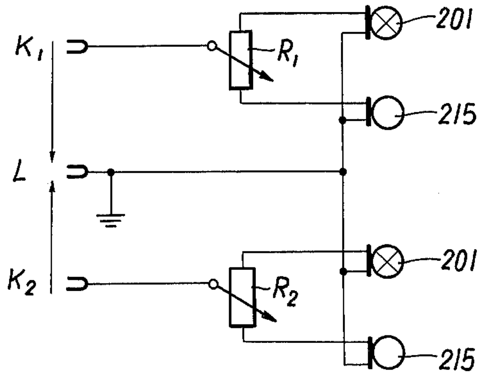
FIG. 12 is a circuit for operating the inventive arrangement.

The electric circuitry for the operation of a controllable double headphone is shown in FIG. 12. In the arrangement represented diagrammatically, transducers 201 and 125 are shown as a pair of transducers provided in each of the earpieces, one pair being associated with the righthand channel R and the other pair with the lefthand channel L, for example. Usually, each transducer comprises two connection wires of which one leads to a common line L which, in most cases, is grounded. The other lead wires of each of the transducer pairs 201 and 215 provided in one earpiece are connected to each other through a potentiometer resistance R1 or R2, respectively, whose sliders are connected to leads K1 (for example, righthand channel) and K2 (for example, lefthand channel). In one end position of the potentiometer, for example, transducer 201 is directly connected to input terminal K1 or K2 while the other transducer 215 is only supplied through the total resistance of potentiometer R1 or R2. The result is that the full input voltage is applied to transducer 201 while only a fraction of the same is applied to transducer 215. Consequently, the acoustic power radiated by transducers 201 and 215 is unequal, i.e., in the example shown, transducer 201 with which, in accordance with the above-described embodiment, a mechanoacoustic transit-time member is associated, furnishes the maximum acoustic power possible with the given input voltage while the output of transducer 215, corresponding to a normal transducer working without additional arrangement, would probably be hardly audible.

In the other end position of potentiometers R1, R2, the conditions are inverted, i.e., the full acoustic power will be radiated, in a usual manner, through transducers 215 while nothing will be audible through transducer 201.

The result obtained is that by displacing the slider of the potentiometer from one end position into the other, the acoustic power can be continuously transferred from one transducer to the other and the proportion of each of the transducers relative to the total acoustic power can be adjusted selectively.

In principle, the arrangement corresponds to the balance controller in stereo devices, however, without having its function. In the present invention, it is only intended to have the possibility in each channel to selectively adjust the proportional performance of two acoustic transducers having unequal properties relative to the total furnished acoustic power in order to obtain a subjectively optimum reproduction.

While specific embodiments of the invention have been shown and described in detail to illustrate the application of the principles of the invention, it will be understood that the invention may be embodied otherwise without departing from such principles.

What is claimed is:

1. An arrangement for headphones for converting frequency modulated audio oscillations into amplitude modulated oscillations, particularly for rendering audible the vibrato of electronic musical instruments, such as electronic organs, comprising a housing, an electroacoustic transducer in said housing having a diaphragm with smooth frequency response zones, and at least one mechanical transit-time member having a transit time from one end to the other not greater than 20 ms connected to said diaphragm.

2. An arrangement for headphones, according to claim 1, wherein said transit-time member is a helical spring extending axially through said electroacoustic transducer and secured, on its one end, to the midpoint of said transducer diaphragm and, on its other end, to said housing.

3. An arrangement for headphones, according to claim 2, wherein said electroacoustic transducer is an electrodynamic actuating system having a central ferromagnetic core provided with an axial bore through which said helical spring extends without contacting said core.

4. An arrangement for headphones, according to claim 3, wherein said helical spring includes first and second portions, said first portion extending inside said core being wound of a thicker wire than said second portion, said second portion being outside of said core.

5. An arrangement for headphones, according to claim 3, wherein said helical spring includes a portion located outside said core which is larger than the portion extending through said core.

6. An arrangement for headphones, according to claim 1, wherein said diaphragm comprises an active diaphragm, a passive diaphragm in said housing spaced from said active diaphragm, said transit-time member being connected between said active and said passive diaphragms, said passive diaphragm being capable of oscillating but being not directly acted upon by said transducer, said headphone housing including an end adapted to be positioned at the wearer's ear, said passive diaphragm being located closer to the end next to the ear and said active diaphragm.

7. An arrangement for headphones, according to claim 6, wherein said housing comprises a dome-shape housing having a bottom, said electroacoustic transducer being secured to said bottom, said diaphragm of said transducer being located in said housing to face the opposite end from said bottom, said opposite end being designed to be placed against the ear of the wearer, said opposite end being closed by said passive diaphragm.

8. An arrangement for headphones, according to claim 7, including a plate disposed across said housing adjacent the end which is adapted to be positioned close to the ear and provided with a plurality of openings, said passive diaphragm being located adjacent said plate and the openings permitting the sound radiated by the active diaphragm to pass directly to the ear.

9. An arrangement for headphones, according to claim 6, wherein said transit-time member comprises a helical spring, said transducer having a moving coil and comprising an electrodynamic transducer, said moving coil acting on a portion of said active diaphragm and said spring being of a diameter equal to the diameter of said coil.

10. An arrangement for headphones, according to claim 6, wherein said housing between said electroacoustic transducer and said passive diaphragm is filled with a foam-like material, said transit-time member extending through said foam-like material without being damped thereby.

11. An arrangement for headphones, according to claim 1, wherein said transit-time member comprises a strip-shape active diaphragm of elastic material which is connected to said passive diaphragm and filling the space between the turns of said active diaphragm, said active diaphragm being made of an extremely soft, lightweight material.

12. An arrangement for headphones, according to claim 11, wherein said active diaphragm comprises a helical diaphragm which is actuated on only one of its two ends.

13. An arrangement for headphones, according to claim 1, wherein said diaphragm is of a shape permitting bending oscillations and is made of an elastic material promoting bending oscillations, said electroacoustic transducer having a member actuating said diaphragm being connected electrically thereto.

14. An arrangement for headphones, according to claim 1, including at least one transit-time member in the form of a helical spring extending in a plane substantially parallel to said diaphragm and connected to said diaphragm intermediate the width thereof.

15. An arrangement for headphones, according to claim 14, wherein said transit-time member comprises two separate helical springs extending parallel to each other and preferably having unequal frequency characteristics, each being disposed alongside said diaphragm and being connected to said diaphragm, and a coupling member extending between said diaphragm and said springs connecting said diaphragm to said springs.

16. An arrangement for headphones, according to claim 15, wherein said coupling members have mutually different frequency dependent transmission properties.

17. An arrangement for headphones, according to claim 15, wherein said coupling members coupling said springs to said diaphragm include portions extending in respective opposite directions from at least one of said springs and having unequal lengths.

18. An arrangement for headphones, according to claim 17, wherein said housing includes a space between said diaphragm and the ear of the user carrying said springs, said springs being connected at respective ends to fixed supports of said housing.

19. An arrangement for headphones according to claim 1, including a further acoustic transducer, an adjustable member having an adjustment which is operable from the exterior connected to said electroacoustic transducer and said further acoustic transducer to effect a proportional response of the two transducers as to the emitted acoustic power.

20. An arrangement for headphones according to claim 19, wherein said transducer and said further acoustic transducer have a common mounting plate, said mechanical transit-time member being mounted on said plate and comprising a helical spring.

21. An arrangement for headphones according to claim 20, wherein said helical spring comprises two spring parts (203, 210) which are disposed at an angle relative to each other and are mounted at each of their ends for oscillation.

22. A headphone arrangement according to claim 21, wherein said two spring parts include a nodal point, a thin short helical spring (207) secured to said nodal point and having an opposite spring end, and a fixed support connected to said opposite spring end and to said mounting plate.

23. A headphone arrangement according to claim 19, including a common control member connected to said transducer and said additional transducer providing a common adjustment therefor.

24. A headphone according to claim 23, wherein said control member comprises a common tandem potentiometer, and an earpiece containing said potentiometer.

25. An arrangement according to claim 23, including an earpiece for each of said transducers and a single potentiometer accommodated in one of said ear pieces.

26. A headphone arrangement according to claim 23, including an earpiece containing each of said potentiometers, and an actuating member for controlling the sound proportion provided on the outside of at least one of said earpieces.

* * * * *